(12) United States Patent
Jayakumar et al.

(10) Patent No.: US 10,819,354 B2
(45) Date of Patent: Oct. 27, 2020

(54) ACCURATE AND RELIABLE DIGITAL PLL LOCK INDICATOR

(71) Applicant: Silicon Laboratories Inc., Austin, TX (US)

(72) Inventors: Kannanthodath V. Jayakumar, Austin, TX (US); James D. Barnette, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 16/580,161

(22) Filed: Sep. 24, 2019

(65) Prior Publication Data

US 2020/0162081 A1    May 21, 2020

Related U.S. Application Data

(63) Continuation-in-part of application No. 16/194,678, filed on Nov. 19, 2018, now Pat. No. 10,608,649.

(51) Int. Cl.
  *H03L 7/095*  (2006.01)
  *H03L 7/093*  (2006.01)
  *H03L 7/099*  (2006.01)
  *H03L 7/087*  (2006.01)

(52) U.S. Cl.
  CPC ............. *H03L 7/095* (2013.01); *H03L 7/087* (2013.01); *H03L 7/093* (2013.01); *H03L 7/0992* (2013.01)

(58) Field of Classification Search
  CPC ....... H03L 7/095; H03L 7/087; H03L 7/0898; H03L 7/18; H03L 7/093; H03L 7/085; H03L 7/0992
  See application file for complete search history.

(56) References Cited

U.S. PATENT DOCUMENTS

| | | | |
|---|---|---|---|
| 5,656,977 A | 8/1997 | Kelkar et al. | |
| 6,278,746 B1 | 8/2001 | Velez | |
| 7,323,946 B2 | 1/2008 | Seefeldt et al. | |
| 7,405,628 B2 | 7/2008 | Hulfachor et al. | |
| 8,552,767 B1 | 10/2013 | Nikaeen et al. | |
| 8,791,734 B1 | 7/2014 | Hara et al. | |
| 10,498,297 B2 * | 12/2019 | Berkhout | H03M 3/45 |
| 10,608,649 B1 | 3/2020 | Jayakumar et al. | |
| 2002/0027886 A1 | 3/2002 | Fischer et al. | |

* cited by examiner

*Primary Examiner* — Jung Kim
(74) *Attorney, Agent, or Firm* — Zagorin Cave LLP

(57) ABSTRACT

A frequency monitoring circuit monitors a frequency offset between a first clock signal and a second clock signal. The frequency monitoring circuit includes a first moving average filter with a plurality of cascaded filter stages and a second moving average filter with a plurality of cascaded filter stages. A plurality of error detection circuits detect if differences between respective cascaded filter stages of the moving average filters exceed respective thresholds. The frequency monitoring circuit asserts a frequency error signal if any of the error detection circuits detect an error. A phase monitoring circuit asserts a phase error if a phase error is above a phase error threshold. The frequency error signal and the phase error signals are combined as a loss of lock signal.

21 Claims, 6 Drawing Sheets

ACCURATE AND RELIABLE DIGITAL PLL LOCK INDICATOR

CROSS-REFERENCE TO RELATED APPLICATION(S)

This application is a continuation-in-part of the application entitled "Relative Frequency Offset Error and Phase Error Detection for Clocks", application Ser. No. 16/194,678, filed Nov. 19, 2018, now U.S. Pat. No. 10,608,649, naming Kannanthodath V. Jayakumar et al. as inventors, which application is incorporated herein by reference in its entirety.

BACKGROUND

Field of the Invention

This invention relates to integrated circuits and more particularly to detecting frequency loss of lock and phase loss of lock conditions.

Description of the Related Art

In general, a clock generator produces an output clock signal having a specified frequency by locking an input clock signal to a reference clock signal. Clock input signals are typically accompanied by jitter, which is a short-term variation in frequency that is noticeable above 10 Hz. Clock wander is a long-term variation in frequency that is noticeable in frequencies below 10 Hz. In addition, clock signals also experience frequency offset, drifts and phase transients or perturbations in phase for limited duration. The clock generator may produce an alarm in response to one or more characteristics of the output signal being outside of clock quality specifications, e.g., frequency and jitter specifications, that vary according to a target application. Conventional clock quality characterization techniques trade off speed of detection with resolution of error detection. Accordingly, improved techniques for evaluating clock signal quality are desired.

SUMMARY OF EMBODIMENTS OF THE INVENTION

In an embodiment, an apparatus includes a frequency monitoring circuit to monitor a frequency offset between a first clock signal and a second clock signal. The frequency monitoring circuit includes a first moving average filter with a plurality of cascaded filter stages and a second moving average filter with a plurality of cascaded filter stages. A plurality of error detection circuits detect if differences between respective cascaded filter stages of the first moving average filter and respective cascaded filter stages of the second moving average filter exceed respective thresholds.

In another embodiment a method includes monitoring a frequency offset between a first clock signal and a second clock signal. The frequency offset monitoring includes receiving first clock period representations of a first clock signal at a first moving average filter having first cascaded filter stages and receiving second clock period representations of a second clock signal at a second moving average filter having second cascaded filter stages. Respective first moving averages are determined in the cascaded first filter stages, each of the first cascaded filter stages providing a different windowing function. Respective second moving averages are determined in the second cascaded filter stages, each of the second cascaded filter stages providing a different windowing function. The frequency monitor circuit determines a first difference between a first output from a first filter stage of the first cascaded filter stages and a second output from a first filter stage of the second cascaded filter stages. The frequency monitor circuit determines a second difference between a third output from a second filter stage of the first cascaded filter stages and a fourth output from a second filter stage of the second cascaded filter stages. The frequency monitor circuit determines a third difference between a fifth output from a third filter stage of the first cascaded filter stages and a sixth output from a third filter stage of the second cascaded filter stages. The frequency monitor circuit compares the first difference to a fast threshold value and supplies a first compare result indicative thereof. The frequency monitor circuit compares the second difference to a medium threshold value and supplies a second compare result indicative thereof. The frequency monitor circuit compares the third difference to a slow threshold value and supplies a third compare result indicative thereof. The frequency monitor circuit asserts a frequency error signal responsive to the first compare result indicating the first difference is greater than the fast threshold value, the second compare result indicating the second difference is greater than the medium threshold value, or the third compare result indicating the third compare result is greater than the slow threshold value.

In another embodiment, an apparatus includes a phase locked loop that has a first time to digital converter to convert a feedback clock signal to a first digital representation, a second time to digital convert to convert a reference clock signal to a second digital representation, and a digital phase and frequency detector coupled to receive the first and second digital representations of the feedback clock signal and the reference clock signal and supply a digital phase difference between the feedback clock signal and the reference clock signal. That apparatus further includes a loss of lock detection circuit that includes a frequency monitoring circuit configured to supply a frequency loss of lock signal, a phase monitoring circuit configured to supply a phase loss of lock signal, and a logical function to combine the frequency loss of lock signal and the phase loss of lock signal into a loss of lock signal. The frequency monitoring circuit includes a first moving average filter that is coupled to the first time to digital converter and has cascaded filter stages. The frequency monitoring circuit further includes a second moving average filter that is coupled to the second time to digital converter and has cascaded filter stages. A first error detection circuit determines a first difference between an output of a first filter stage of the first moving average filter and an output of a first filter stage of the second moving average filter and compares the first difference to a first threshold value and supplies a first compare result indicative thereof. A second error detection circuit determines a second difference between an output of a second filter stage of the first moving average filter and an output of a second filter stage of the second moving average filter and compares the second difference to a second threshold value and supplies a second compare result indicative thereof. A third error detection circuit determines a third difference between an output of a third filter stage of the first moving average filter and an output of a third filter stage of the second moving average filter and compares the third difference to a third threshold value and supplies a third compare result indicative thereof. A frequency error detection circuit is configured to assert the frequency loss of lock signal responsive to the first compare result indicating the first difference is greater than the first threshold value, the second compare result indicating the second difference is greater than the second threshold value, or the third compare result indicating the third compare result is greater than the third threshold value. A phase error monitoring circuit is coupled to receive the digital phase difference and assert the phase loss of lock signal responsive to the digital phase difference being greater than a phase error threshold value.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
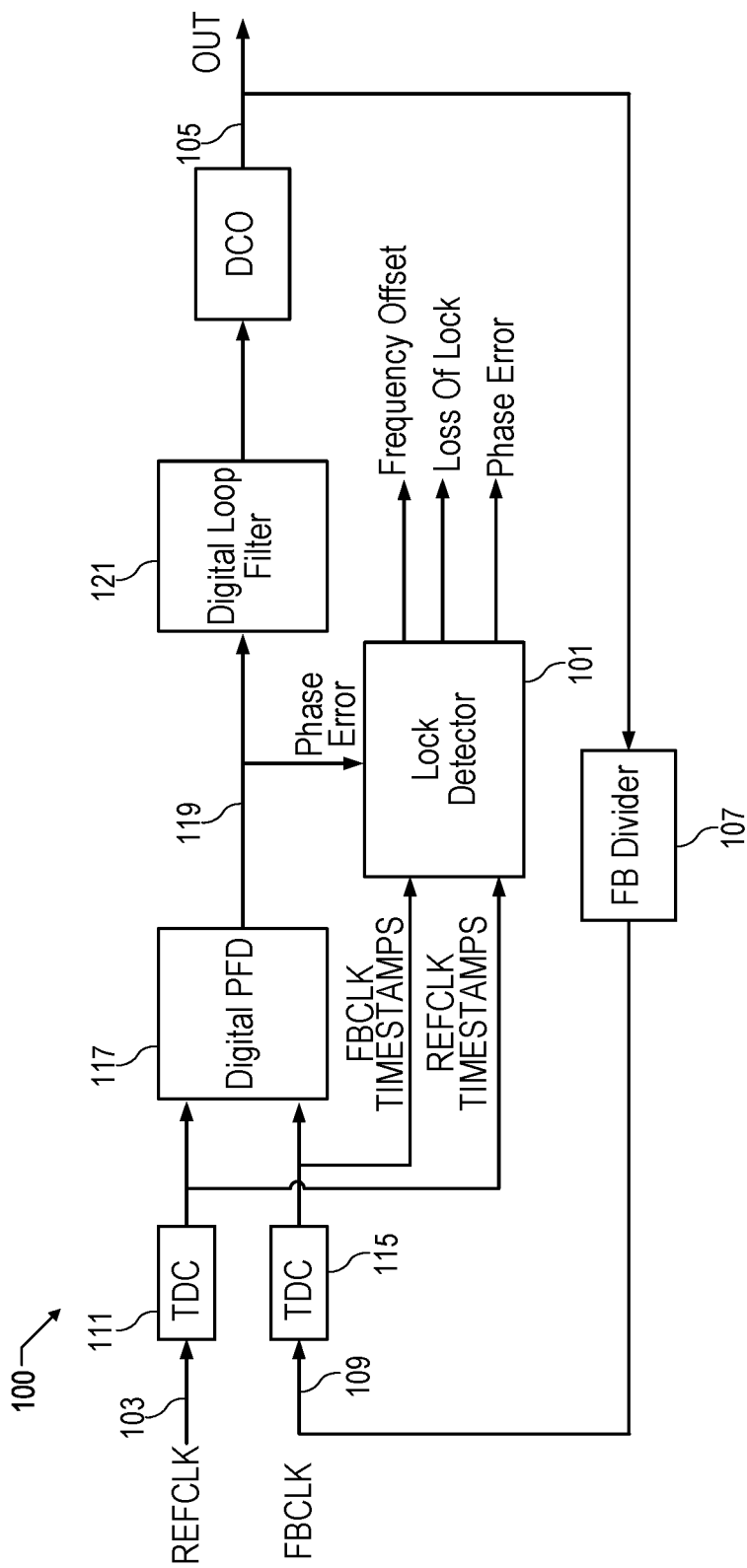
FIG. 1 illustrates a high level block diagram of a system that includes a phase-locked loop (PLL) and a lock detector.

FIG. 1 illustrates a high level block diagram of a system that includes a phase-locked loop (PLL) 100 and a lock detector 101. The PLL receives a reference clock signal 103, which can be supplied, e.g., from a crystal oscillator, a microelectromechanical structure (MEMS) oscillator, or other suitable low-jitter clock source. The PLL 100 supplies an output clock signal 105. A feedback divider 107 receives the output clock signal 105 and supplies a feedback clock signal 109. Time to digital converters (TDCs) 111 and 115 convert the reference clock signal 103 and the feedback clock signal 109 to digital representations of the clock signals, which are supplied, e.g., as time stamps, to a digital phase and frequency detector (PFD) 117. PFD 117 supplies a phase error 119 indicating the frequency/phase difference between the reference clock signal 103 and the feedback clock signal 109. A digital loop filter 121 and the lock detector 101 both receive the phase error from digital PFD 117.

Lock detector 101 also receives the time stamps from TDCs 111 and 115. In at least one embodiment time-to-digital converter 111 and time-to-digital converter 115 are implemented by corresponding counter circuits. The lock detector uses these time stamps to measure the frequency offset between the clocks and provide the frequency lock status. The lock detector utilizes both time resolution and frequency resolution in determining whether the system is in lock or out of lock.

In an embodiment, the lock detector 101 provides a loss of lock indicator when there is either a phase loss of lock or a frequency loss of lock. The lock detector tracks the phase error information from the digital PFD 117 to determine if the PLL is phase locked. The frequency loss of lock indicates that the frequency offset between the reference clock signal 103 and the feedback signal 109 is larger than a frequency offset threshold. The phase loss of lock indicates whether the phase error is larger than a phase error threshold. In addition, the lock detector 101 provides a quantitative value of the frequency offset and the phase error. Most existing techniques provide either phase or frequency lock monitoring but not both. In addition, existing techniques do not address the stochastic behaviors of the reference clock and how to provide a faster unlock detection during those transient events and avoid any chattering of lock status for steady state operation.

Embodiments described herein provide multiple filtering stages of time stamps of the reference and feedback clocks from the TDCs to provide a simple, continuous, fast and accurate sub ppb accuracy of frequency lock status. Embodiments also provide different levels of phase error averaging to provide sub picoseconds of accuracy for phase lock status. Embodiments also use bandwidth-based counters to provide extended stable lock status for steady state lock conditions.

Figure 2:
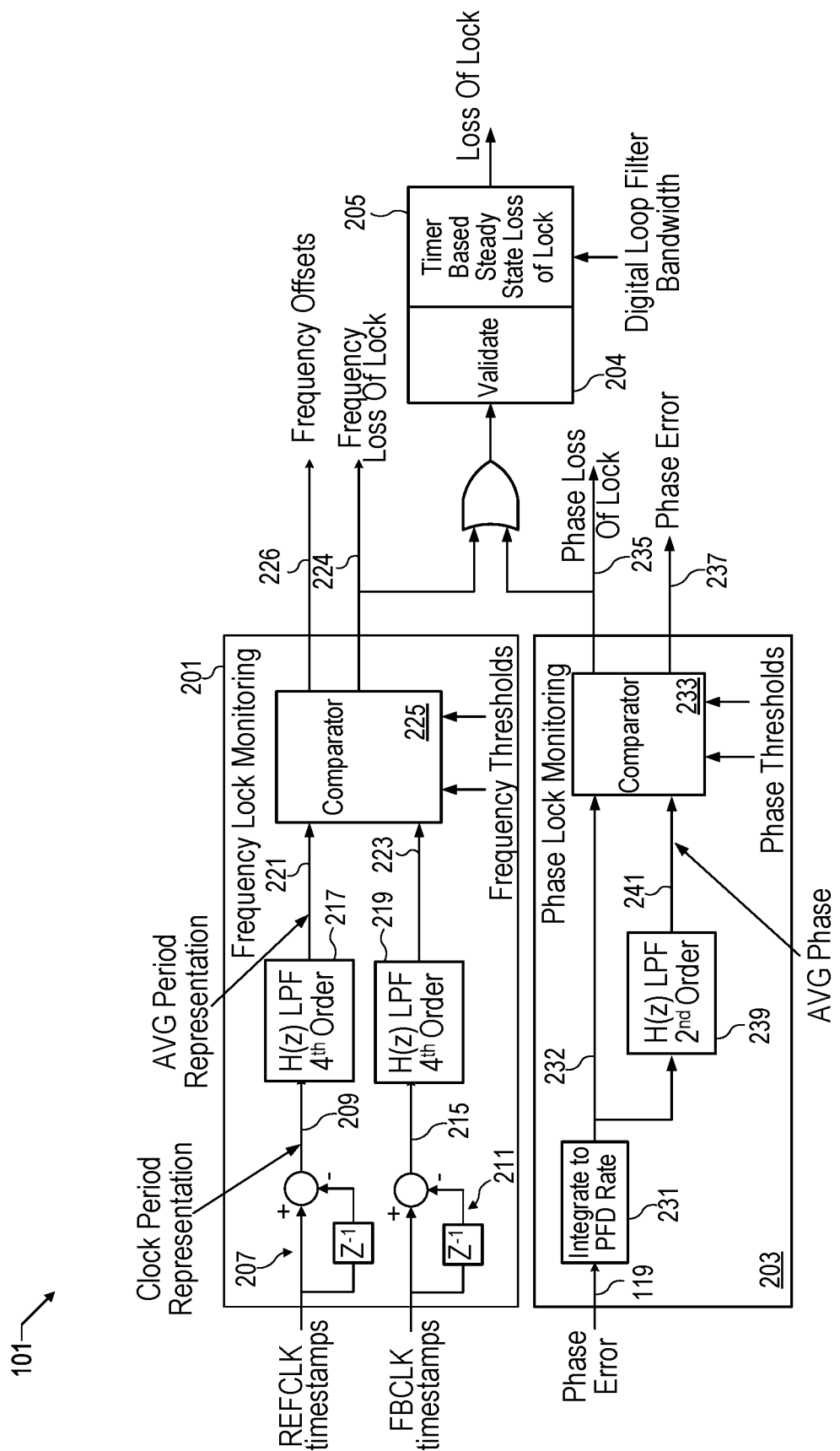
FIG. 2 illustrates a functional block diagram of a lock detector circuit that includes a frequency lock monitoring circuit and a phase lock monitoring circuit.

FIG. 2 illustrates a block diagram of the lock detector 101. Lock detector 101 includes a frequency lock monitoring circuit 201, phase lock monitoring circuit 203, and a validate circuit 204 and timer-based loss of lock clearing circuit 205 that tracks the loop filter bandwidth settings. The frequency lock monitoring circuit 201 receives the time stamps. Assume each time stamp represents a digital time corresponding to a rising edge of a clock signal. A difference circuit 207 receives the time stamp representations of REFCLK and generates a clock period representation 209. Difference circuit 211 receives the time stamp representations of FBCLK and generates a clock period representation 215 of the feedback clock. Filters 217 and 219 respectively receive the clock period representations 209 and 215 and supply average period representations 221 and 223 to comparator logic 225 to determine if the average periods of the REFCLK and FBCLK differ by more than a threshold amount. The frequency lock monitoring circuit supplies a frequency loss of lock indication 224 and frequency offsets 226. Relative frequency offset detection can be defined as the frequency offset between two clock signals. In the frequency clock monitoring circuit 201, frequency offset detection detects frequency offset between the reference clock signal and the feedback clock signal. Frequency offset between the reference clock and the feedback clock is defined in $$\text{ppm as} = \frac{\Delta f}{F} * 10^6 = -\frac{\Delta t}{T} * 10^6.$$

Here $\Delta f$ is the frequency difference between the reference clock and the feedback clock and "F" is the frequency of the feedback clock. The frequency and phase loss of lock monitoring circuits determine whether noise or other impairments accompanying the reference clock signal and/or the feedback clock signal are greater than or less than thresholds defined by standards or target applications. A frequency of a clock signal is measured in cycles per true second, which can be measured or estimated by computing a first derivative of a timestamp with respect to true time. Lock detector circuit 101 also includes phase lock monitoring circuit 203. The phase error/time error of a clock is the difference between the time indicated by clock under test and a reference clock which can be denoted as phase error (t)=$T_{fb}$(t)−$T_{ref}$(t). In an embodiment the phase lock monitoring circuit receives phase errors 119 that are oversampled in the digital PFD 117 (see FIG. 1). Integrator 231 integrates the samples to a rate corresponding to a non-oversampled PFD rate and supplies the integrated phase error 231.

Comparator 233 receives the integrated phase error 232 and compares the phase error 232 to a threshold phase error value and supplies a phase loss of lock indicator 235 indicative of the comparison along with the phase error amount 237. In addition, in embodiments, a low pass filter 239 receives the phase error 232 and supplies an average phase error 241. While FIG. 2 shows filter 239 as a second order filter, in other embodiment a higher order filter may be used to get better filtering of the noise present in the phase error information and hence more accurate detection of phase lock status. The choice of filter depends on system requirements. The comparator circuit 233 compares the average phase error 241 to a threshold average phase error value to determine a loss of lock condition. Comparisons of either or both of the average phase error 241 and the phase error 232 to respective thresholds may be used to determine when to assert the phase loss of lock signal 235.

Figure 3:
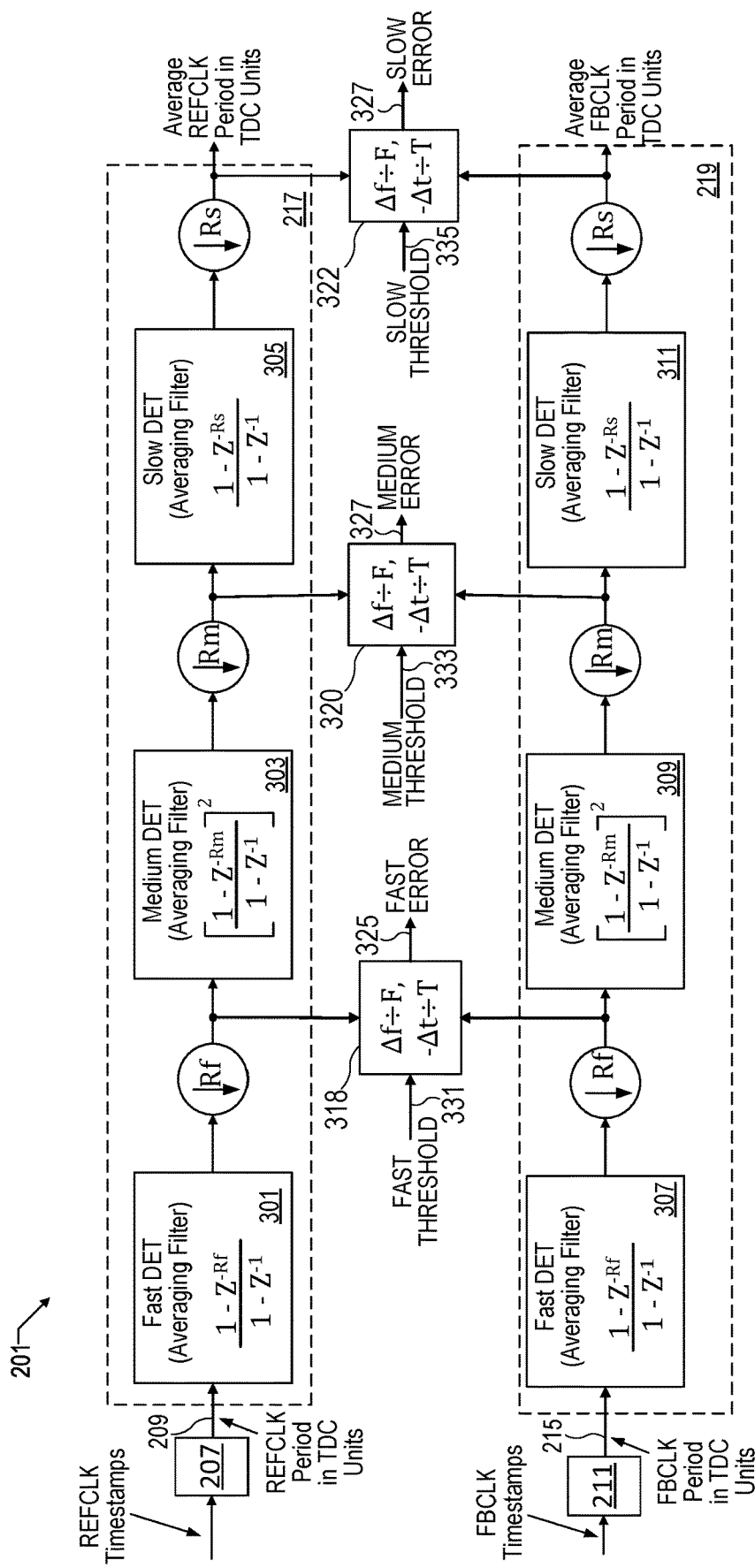
FIG. 3 illustrates additional details of a frequency lock monitoring circuit that uses cascaded filters.

FIG. 3 shows additional details of an embodiment of the filters 217 and 219 used in the frequency lock monitoring circuit 201. The filters implement a moving average filter. The moving average filter reduces input noise by the square root of the number of points N in a window of points used in each average. In general, an increase in the number of points in the window of a moving average filter (long window) degrades time resolution but increase frequency resolution. A decrease to the number of points in the window (short window) increases time resolution but degrades frequency resolution. Time resolution refers to precision of a measurement with respect to time, e.g., how close in time ΔT two events can occur and still be separately measured. By viewing signals locally in time, the signal is approximately stationary (i.e., does not change over time) and can be analyzed using Fourier transform techniques. Regarding the associated frequency spectrum, frequency resolution refers to precision of a frequency measurement in Hz, e.g., the frequency spacing ΔF between data points of the frequency spectrum, and is determined by the window length (i.e., Δf=1/T). The frequency resolution equals the signal bandwidth divided by half the number of data points. The signal bandwidth is the maximum frequency that can be analyzed according to the Nyquist sampling theorem (i.e., the maximum frequency is half the sampling rate). For example, a bandwidth of 32 MHz with 32 data points will have a frequency resolution of 2 MHz. Thus, the frequency resolution increases with the number of data samples.

FIG. 3 shows the basic operation of using the time stamps. A digital representation of the clock signals (timestamps in FIG. 2) are passed through a filtering operation (shown in FIG. 2 as filters 207 and 211 in FIG. 2) to generate the first difference of timestamps, which is the clock period representation of the clock under test. This clock period representation is in timestamp units and in embodiments, filter calculations are based in timestamp units. The higher order filtering shown in FIG. 3 removes the noise (jitter/wander) accompanying the clock under test to provide accurate detection.

A moving average filter provides real time or continuous monitoring of the input data that tracks transients. The moving average filter difference equation is $$y[n] = \frac{1}{R}\sum_{k=0}^{R-1} x[n-k],$$

which represent the first R terms of a geometric series, and the frequency response is given as $$H_{lp} = \frac{1}{R}\left[\frac{1-Z^{-R}}{1-Z^{-1}}\right].$$

The frequency response is similar to a cascaded integrator-comb filter (CIC) and thus embodiments utilize CIC filters. Conventional monitor circuits use only one filter stage that fixes the time resolution and frequency resolution to a single combination that trades off speed of error detection with accuracy of error detection and limits use of the monitor circuit to specific applications. Use of a single moving average window/filtering function creates conflict between time and frequency resolution. As one improves, the other degrades. Using a single window/averaging provides no flexibility to the time and frequency resolution for fast and accurate detection. That restricts the degree of freedom for wider application/requirements. In contrast, a moving averaging filter avoids the dead time issues of filters used in conventional monitor circuits that analyze a single window with discontinuities in measurement. The CIC or a moving average filter provides real time or continuous monitoring of the input data so that it can track all the transients as opposed to using a single analysis window.

The input reference clock signal is stochastic in nature therefore it is necessary to rely on temporal resolution for faster detection and highly filtered data to declare lock to achieve sub ppb accuracy. In one or more embodiments the filters shown in FIG. 3 are programmable to achieve resolution in parts per trillion (ppt) level accuracy. The filters are programmed based on a number of factors. For example, one factor is the detection target in terms of ppt. In addition, the programming depends on the reference clock noise profile. The desired detection speed information and accuracy can also factor into the programming. Based on this information one can determine the amount of filtering that needs to be added to the received time stamp information to achieve the required ppt target. That information regarding the amount of filtering is then distributed across the fast, medium, and slow filtering stages. The fast, medium and slow averaging windows and thresholds are programmed to optimize the fast, medium, and slow filtering stages for the particular criteria of ppt target, noise profiles, and desired detection speeds.

A desirable solution detects localized temporal changes (higher temporal resolution) and the need to address higher frequency ppm resolution. Thus, it is desirable to have a circuit that minimizes Δt, Δf product. Time resolution is inversely proportional to window length and frequency resolution is directly proportional to window length.

It has been shown that a Gaussian window filter is a suitable filter architecture to minimize the Δt, Δf time bandwidth product. As it is desirable to provide good time resolution for faster detection and good frequency resolution for higher accuracy, the filter implementation should tend towards a Gaussian filter. The input data streams are broken into smaller sections (smaller frames) and smaller sections are used in the analyzing algorithm. This is required for a detection circuit to analyze signals that contain both slowly varying components and rapidly changing transient events. Based on the central limit theorem, the Gaussian filter can be approximated by several runs of a very simple filter such as the moving average filter. Taking advantage of that theory, the filters in FIG. 3 utilize a cascaded "moving average filter" chain to get the good time frequency resolution.

Referring again to FIG. 3, the cascaded fourth order filter 217 includes a fast detect averaging filter stage 301, a medium detect averaging filter stage 303, and a slow detect averaging filter stage 305. The cascaded fourth order filter 219 includes a fast detect averaging filter stage 307, a medium detect averaging filter stage 309, and a slow detect averaging filter stage 311. Cascaded filter stages provide improved noise performance and reduce the time-bandwidth product. The fast and medium stages of the filter chain provide time localization and provide faster frequency offset error detection and the last stages of the filter (medium, slow) provide better frequency resolution. The combined results from all the stages are used for fast and accurate detection.

Here the first difference of timestamps (period representation) are passed through cascaded filter chains. The down sampling ratio 'R' of the moving average filters are controllable. The value of "R" is chosen in power of 2 quantities to optimize the hardware and for ease of analysis. A wide range of controllability is available to meet different applications. The overall filter transfer function is $$H_{fr} = \left[\frac{1-Z^{-R_{fast}}}{1-Z^{-1}}\right] \times \left[\frac{1-Z^{-R_{med}}}{1-Z^{-1}}\right]^2 \times \left[\frac{1-Z^{-R_{slow}}}{1-Z^{-1}}\right],$$

where Rf, Rm, Rs determine the individual window lengths and the window length of the slow filter is cumulative of the individual window lengths.

The filter structure shown in FIG. 3 provides an overall 4th order filtering of the noise. The number of cascaded stages can be increased to be more precise, but the extra stages require a large area for limited benefits. A three-cascaded stage filtering meets known requirements although other embodiments can have a difference number of filtering stages depending on the application. The medium filter stages (303, 309) utilize 2nd order moving average filters that provide higher attenuation to the quantization noise from the analog to digital converter (ADC) used in generating the timestamps and jitter/wander on the clocks. The fast filter stages (301, 307) are first order moving average filters, and in embodiments are a simpler implementation than the medium stage as the fast stages implement a down-sampling plus a difference function on the timestamps using the integrator function of the ADC that provides the time stamps. The slow stages (305, 311) provide additional filtering of jitter and especially wander noise for better accuracy and frequency resolution. The slow detection filter stages utilize a first order moving average filter.

The fast (301, 307) and medium filter stages (303, 309) address fine temporal changes for error detection while the slow stages address the frequency resolution to determine the error detection. If time resolution is defined as Tr, then two impulses separated by at least Tr will provide 2 distinct peaks by the output of the filter. Table 1 illustrates the measurement resolution obtained by an exemplary frequency lock cascaded filters shown in FIG. 3. Table 1 illustrates circuit measurement resolution that is obtained by an exemplary frequency monitor circuit having $T_r$=16 ps. Shorter windows are used to detect high frequency transients and longer windows are used for lower frequencies.

TABLE 1

| Circuit Measurement Resolution | | | | |
|---|---|---|---|---|
| | $R_m$ | Frequency (Hz) | Detection Time (ns) | Resolution (ppm) |
| Input Clock | | 16384000 | | |
| Fast Div Ratio | 5 | 512000 | 1953.13 | 1.4482 |
| Medium Div Ratio | 4 | 16000 | 62500 | 0.004 |
| Slow Div Ratio | 2 | 2000 | 500000 | 0.0002 |

Figure 4:
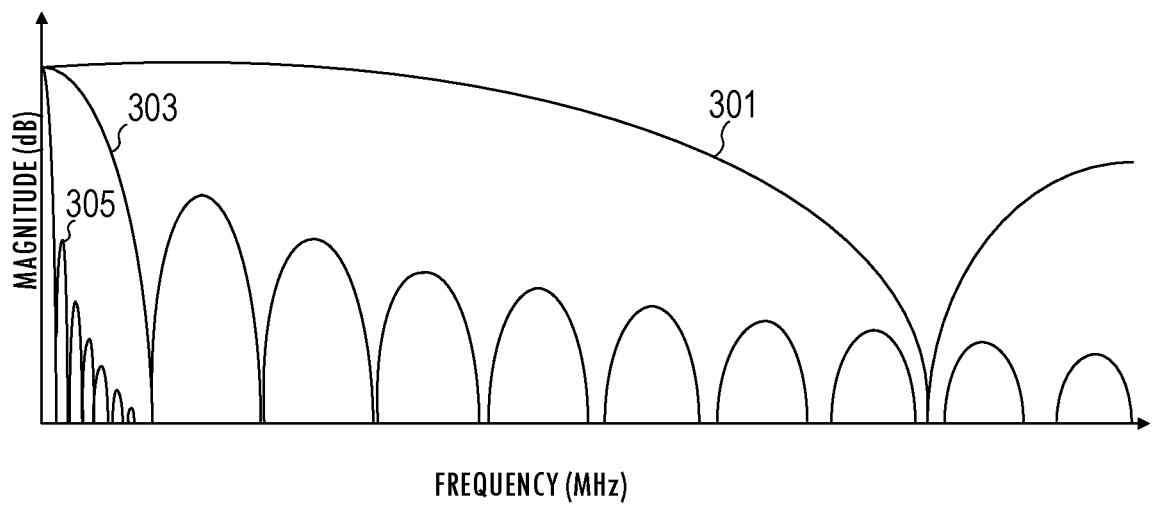
FIG. 4 illustrates a frequency response of the exemplary frequency lock monitoring circuit.

FIG. 4 illustrates a frequency response of the exemplary frequency lock monitoring circuit 201 of FIG. 3. As seen from magnitude response plots of FIG. 4 and Table 1 showing detection time and frequency resolution, the cascaded moving average structure provides good performance for the measurement circuit. The different windows at different stages allows for fast detection of high frequency transients and longer windows for higher frequency resolution. In Table 1, 16.384 MHz represents the input time stamp rate. "Div" represents the window length. For example, Fast Div Ratio=5 means the window length=$2^5$=32 samples of averaging. The 16.384 MHz time code samples are divided down to 512 kHz time codes period representations. As shown in the example of Table 1, with an input timestamp sample rate equal to 16.384 MHz, the fast sample rate (Fs) is 512 kHz (16.384 MHz/$2^5$), the medium sample rate Fs=16 kHz (512 kHz/$2^{(4+1)}$) and the slow sample rate Fs is 2 kHz (16 kHz/$2^{(2+1)}$). Table 1 further shows the detection times and the resolution.

Figure 5:
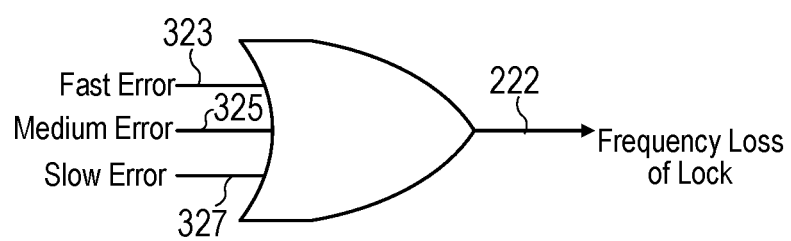
FIG. 5 illustrates the logical combination of the fast, medium, and slow frequency errors.

Referring again to FIG. 3, frequency monitor 201 includes detection circuit 318, detection circuit 320, and detection circuit 322, which respectively generate a fast error indicator 325, a medium error indicator 327, and a slow error indicator 329, and correspond to comparator 225 in FIG. 2. Each of the error detection circuits generates an output error signal based on a comparison of the filter stage output for the reference clock signal to the filter stage output for the feedback clock signal and compares the difference between the two clock signals to a threshold difference value (FAST 331, MEDIUM 333, and SLOW 335) specific to the filter stage. FIG. 3 also shows the calculations involved in the frequency offset error detection. As mentioned earlier, the frequency offset between the reference clock and the feedback clock is defined in $$\text{ppm as} = \frac{\Delta f}{F} * 10^6 = -\frac{\Delta t}{T} * 10^6,$$

where Δf is the frequency difference between the reference clock signal and feedback clock signal and "F" is the frequency of the feedback clock. The calculation is done at each of the filtering stages and provided as the frequency offsets 226 (See FIG. 2). The thresholds for each stage depend on the desired measurement accuracy and application or system requirements on threshold and detection times. While one threshold is shown, two thresholds may be provided to the detection circuits, one for setting a frequency error and one for clearing the frequency error. That can help reduce chattering in the frequency loss of lock assertion. Referring to FIG. 5, the final error determination is the logical combination of all the status from the individual stages of the circuit. The final error is declared as soon as soon as either the fast, medium, or slow detection circuits detect an error. In an embodiment, the frequency error is cleared only after all the individual alarms are cleared for a slow detection window cycle. Embodiments utilize other conditions, described further herein, before clearing an error.

The cascaded filter provides good frequency resolution at lower frequencies and good time resolutions at higher frequencies. The loss in time resolution at lower frequencies does not present issues in the applications as frequency components are relatively constant. The loss in frequency resolution at high frequency is also minor as high frequency components are composed of primarily transient events whose separation and identification require good time resolution.

Figure 6:
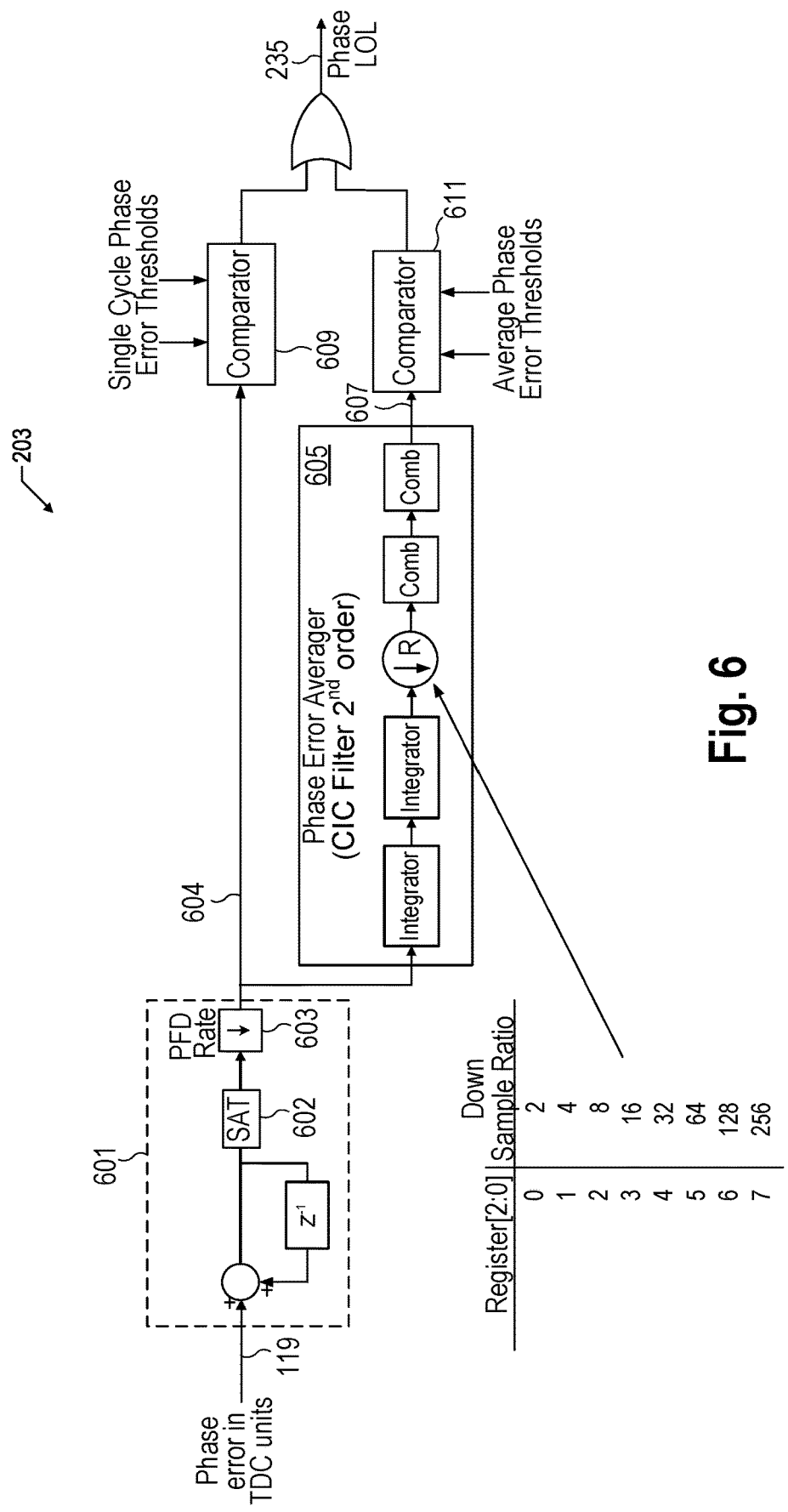
FIG. 6 illustrates a functional block diagram of an embodiment of a phase lock monitoring circuit.

FIG. 6 illustrates additional details of an embodiment of the phase monitoring circuit 203. The phase monitoring circuit uses phase error information from the digital PFD circuit to detect whether the error is within the phase error threshold to determine if the PLL is phase locked. The phase error 119 provided by the digital PFD is at an interpolated PFD rate. In an embodiment, the phase error information provided by the PFD is at N×PFD frequency, where N is the interpolation factor. The phase error that the PFD measures is distributed in smaller chunks at higher speed to the lock detection circuit. The PFD sends the phase error in this way due to interface requirements with the loop filter. The phase error circuit 203 utilizes an integrate and dump circuit 601 to integrate the phase error 119 from the digital PFD and determine if the phase error has exceeded the phase lock threshold. The integrated and dump circuit accumulates samples over a chosen measurement time frame (N samples) and then "dumps" the resulting value. The saturation block 602 ensures the value of the PFD error does not exceed the limit and roll over from, e.g., a high value to a low value. As discussed, earlier the PFD provides the phase error information at N×PFD frequency. The integrator accumulates the phase error for N samples. The down sampler 603 dumps the integrated phase error at the PFD frequency, which is at the down sampled rate compared to the input rate. That allows the phase lock monitoring circuit 203 to assert a loss of phase lock for single event transients of the reference or feedback clock that cause a phase error larger than the phase thresholds. In order to deal with the stochastic nature of the input clock, the phase error detect circuit can be used for fast loss of lock triggering. However, the reference clock signal includes noise due to, e.g., jitter and wander and the feedback clock signal can also include noise and the threshold settings should accommodate an appropriate margin for such noise so as to not trigger too often due to transient events.

In one or more embodiments, the phase monitor circuit 203 also provides average phase error information. A phase error average circuit 605 uses the information from the integrate and dump circuit and passes it through a second order CIC filter. This filter has a programmable averaging window length (by adjusting the down sample ratio as desired) to adjust the window length. The CIC filter removes high frequency noise. As averaging is increased the phase error will approach DC (static) phase error information, which can be considered as the true phase lock condition. Embodiments select the phase loss of lock signal 235 to be based on the output of comparator 611, which compares the average phase error 607 to an average phase error threshold or on the output of comparator 609, which compares the single cycle phase error 604 to a single cycle phase error threshold, or both. In an embodiment shown in FIG. 6 the outputs of comparators 609 and 611 are ORed and supplied as phase loss of lock 235. Note that separate set and clear thresholds may be supplied to each comparator 609 and 611.

Figure 7:
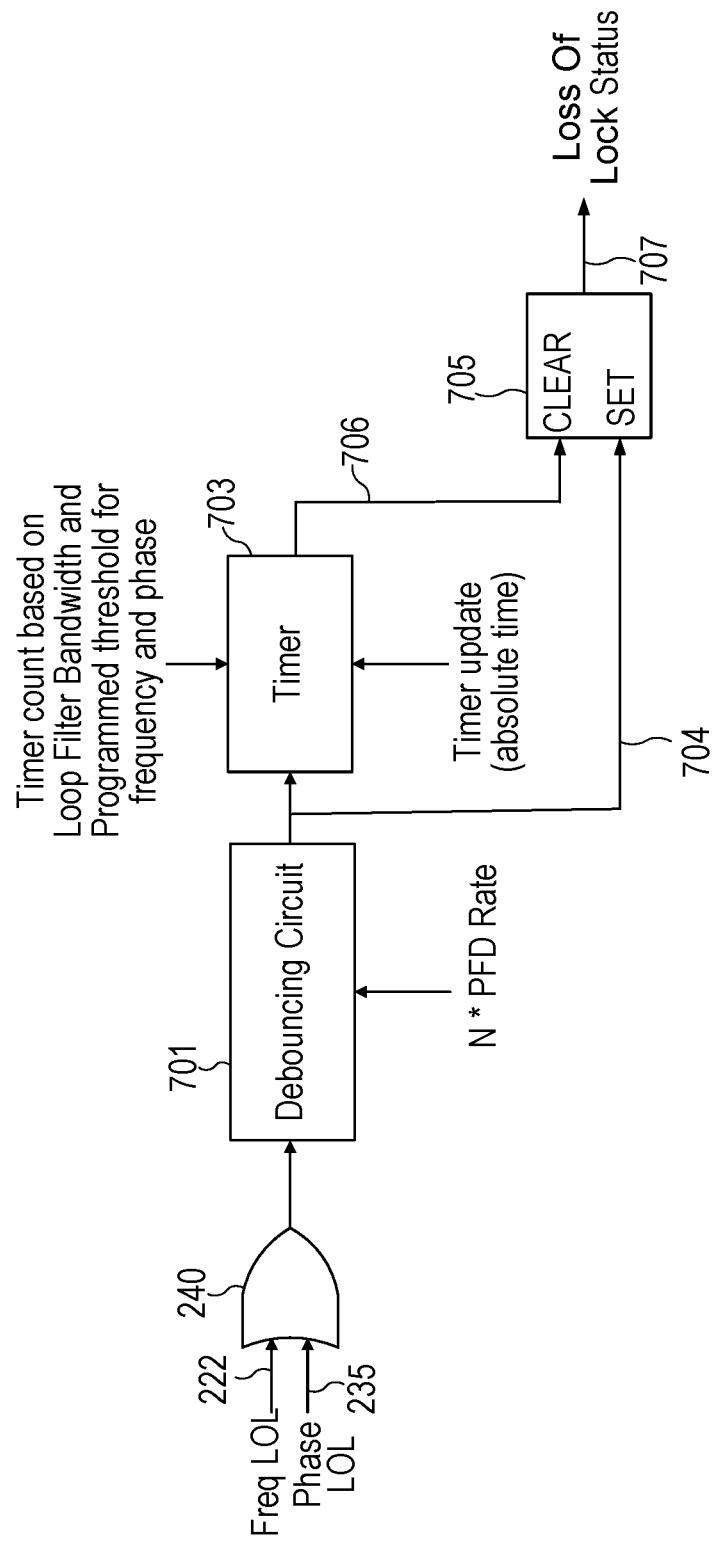
FIG. 7 illustrates a functional block diagram of a debouncing circuit and timer circuit used to provide stability in setting the loss of lock indicator and for clearing the loss of lock indicator.

FIG. 7 illustrates a high level block diagram of an embodiment of the validate circuit 204 and timer based loss of lock circuit 205 (see FIG. 2) that provides higher reliability for the detection status of the loss of lock condition. OR gate 240 supplies the OR of the frequency loss of lock signal 224 and the phase loss of lock signal 235 to debouncing circuit 701. The validation circuit 204 is implemented as debouncing circuit 701 and ensures the loss of lock condition from OR gate 240 is stable before being supplied to the timer circuit 703. In an embodiment the time criteria for a stable signal is N×PFD rate, where N is an integer and the PFD rate is the rate of the feedback clock, which clocks the PFD. The predetermined stability time period determined by N and the PFD rate is based, e.g., on the bandwidth of the loop filter of the PLL or some other criteria. The debouncing circuit supplies a loss of lock signal 704 that is reliably stable for a predetermined time period to declare a lock (or unlock condition) to the timer circuit 703. The debouncing circuit helps to avoid chatter (undesired toggling) on the loss of lock status and improves reliability of the lock status. The debouncing circuit 701 provides programmable protection to chattering of the status as it uses a window mechanism at both assertion and clearing of the loss of lock status to avoid any chattering of the status provided to the external user.

The additional time circuit 703 is configured based on the digital loop filter bandwidth setting (Δ3 dB point) and programmable frequency and phase thresholds. The timer provides an additional wait for loss of lock status clearing. In an embodiment, the additional timer delay in timer 703 is based on theoretical lock time factor that the PLL takes based on the frequency and phase threshold limits for loss of lock used by the detection circuits. For example, if the frequency lock threshold is set to 100 parts per billion (ppb) accuracy, the timer 703 is programmed for the time that the PLL will take with a defined bandwidth to pull in the 100 ppb. Thus, timer 703 takes into account desired or theoretical lock time based on the loop bandwidth configuration of the part to determine the additional timer requirement. A table may store times for clearing the loss of lock based on bandwidth of the loop filter, loss of lock condition (phase loss of lock or frequency loss of lock), and the threshold associated with the loss of lock condition that triggered loss of lock (phase error average, phase error single cycle, frequency loss of lock fast, frequency loss of lock medium, and frequency loss of lock slow). Using the times in the table to determine the timer length allows the final loss of lock status to be cleared in alignment with PLL bandwidth. That ensures the loop is fully settled before the loss of lock is cleared. Detection status (phase and frequency lock) is monitored during the time and the timer 703 gets reset if during the timer interval there is a change in the detection output, e.g., from OR gate 240 and/or from the debouncing circuit 701. Otherwise, the frequency (or phase) error can be below the threshold but the loop is still pulling in to lock and settle at the target frequency and/or phase. The lower the threshold associated with the triggering condition for the loss of lock, the less time it takes for the loop to fully settle. The debouncing circuit 701 and timer circuit 703 help ensure the system provides a robust and accurate lock detection indication. In an embodiment, the output from the debouncing circuit 701 sets the loss of lock indicator 707 supplied from logic circuit 705 and the output 706 from the timer circuit 703 clears the loss of lock indicator. In embodiments, the output 707 is supplied off chip.

Thus, techniques have been described for quickly and accurately detecting frequency loss of lock and phase loss of lock. The description of the invention set forth herein is illustrative and is not intended to limit the scope of the invention as set forth in the following claims. Variations and modifications of the embodiments disclosed herein may be made based on the description set forth herein, without departing from the scope of the invention as set forth in the following claims.

What is claimed is:

1. An apparatus comprising:
a frequency monitoring circuit to monitor a frequency offset between a first clock signal and a second clock signal, the frequency monitoring circuit including,
a first moving average filter with a first plurality of cascaded filter stages, the first moving average filter coupled to a representation of the first clock signal;
a second moving average filter with a second plurality of cascaded filter stages, the second moving average filter coupled to a representation of the second clock signal; and
a plurality of error detection circuits to detect if differences between respective outputs of the first plurality of cascaded filter stages of the first moving average filter and respective outputs of the second plurality of cascaded filter stages of the second moving average filter exceed respective thresholds.

2. The apparatus as recited in claim 1 wherein the first clock signal is a reference clock signal supplied to a phase-locked loop (PLL) and the second clock signal is a feedback clock signal supplied from a feedback divider of the PLL.

3. The apparatus as recited in claim 1,
wherein each of the first plurality of cascaded filter stages provide a different windowing function for first clock period values of the first clock signal;
wherein each of the second plurality of cascaded filter stages provide a different windowing function for second clock period values of the second clock signal; and
wherein the error detection circuits include,
a first error detection circuit to determine a first difference between a first output from a first filter stage of the first plurality of cascaded filter stages and a second output from a first filter stage of the second plurality of cascaded filter stages and to compare the first difference to a fast threshold value and supply a first compare result indicative thereof;
a second error detection circuit to determine a second difference between a third output from a second filter stage of the first plurality of cascaded filter stages and a fourth output from a second filter stage of the second plurality of cascaded filter stages and compare the second difference to a medium threshold value and supply a second compare result indicative thereof;
a third error detection circuit to determine a third difference between a fifth output from a third filter stage of the first plurality of cascaded filter stages and a sixth output from a third filter stage of the second plurality of cascaded filter stages and compare the third difference to a slow threshold value and supply a third compare result indicative thereof; and
a frequency error detection circuit configured to assert a frequency error signal responsive to the first compare result indicating the first difference is greater than the fast threshold value, the second compare result indicating the second difference is greater than the medium threshold value, or the third compare result indicating the third compare result is greater than the slow threshold value.

4. The apparatus as recited in claim 3 further comprising:
a phase-locked loop (PLL) including a first time to digital converter to convert the first clock signal to a first digital representation of the first clock signal and a second time to digital converter to convert the second clock signal to a second digital representation of the second clock signal.

5. The apparatus as recited in claim 4 comprising:
a first difference filter coupled to the first time to digital converter to provide the first clock period values as the representation of the first clock signal; and
a second difference filter coupled to the second time to digital converter to provide the second clock period values as the representation of the second clock signal.

6. The apparatus as recited in claim 3, further comprising:
a logic circuit to logically OR the frequency error signal and a phase error signal and provide a timing error signal; and
a validation circuit to determine if the timing error signal is stable for a predetermined time period prior to supplying a validated timing error signal.

7. The apparatus as recited in claim 6, further comprising:
a loss of lock status clearing circuit coupled to receive the validated timing error signal and supply a loss of lock status indicating whether a loss of lock condition exists; and
wherein the loss of lock status clearing circuit is configured to deassert the timing error signal responsive to a timer setting that is based, at least in part, on a bandwidth of a phase-locked loop associated with the loss of lock status.

8. The apparatus as recited in claim 7, wherein the timer setting is further based on the fast threshold value, the medium threshold value, or the slow threshold value.

9. The apparatus as recited in claim 1, further comprising:
a phase error monitoring circuit coupled to receive a phase difference signal indicative of a phase difference between the first clock signal and the second clock signal, the phase error monitoring circuit configured to monitor the phase difference between the first clock signal and the second clock signal and assert a phase error signal responsive to the phase difference being greater than a phase threshold.

10. The apparatus as recited in claim 9, wherein the phase error monitoring circuit further comprises:
a filter to provide a phase error average between the first clock signal and the second clock signal; and
a compare circuit to compare the phase error average to a phase error average threshold and assert the phase error signal responsive to the phase error average being above the phase error average threshold.

11. A method comprising:
monitoring in a frequency monitoring circuit a frequency offset between a first clock signal and a second clock signal;
receiving a representation of the first clock signal at a first moving average filter having a first plurality of cascaded filter stages;
receiving a representation of the second clock signal at a second moving average filter having a second plurality of cascaded filter stages; and
detecting, using a plurality of error detection circuits, if differences between outputs of respective ones of the first plurality of cascaded filter stages and outputs of respective ones of the second plurality of cascaded filter stages exceed respective thresholds.

12. The method as recited in claim 11 further comprising:
receiving first clock period representations of the first clock signal as the representation of the first clock signal at the first moving average filter having the first plurality of cascaded filter stages;
receiving second clock period representations of the second clock signal as the representation of the second clock signal at the second moving average filter having the second plurality of cascaded filter stages;
determining respective first moving averages in the first plurality of cascaded filter stages, each of the first plurality of cascaded filter stages providing a different windowing function;
determining respective second moving averages in the second plurality of cascaded filter stages, each of the second plurality of cascaded filter stages providing a different windowing function;
determining a first difference between a first output from a first filter stage of the first plurality of cascaded filter stages and a second output from a first filter stage of the second plurality of cascaded filter stages;
determining a second difference between a third output from a second filter stage of the first plurality of cascaded filter stages and a fourth output from a second filter stage of the second plurality of cascaded filter stages;
determining a third difference between a fifth output from a third filter stage of the first plurality of cascaded filter stages and a sixth output from a third filter stage of the second plurality of cascaded filter stages;
comparing the first difference to a fast threshold value and supplying a first compare result indicative thereof;
comparing the second difference to a medium threshold value and supplying a second compare result indicative thereof;
comparing the third difference to a slow threshold value and supplying a third compare result indicative thereof; and
asserting a frequency error signal responsive to the first compare result indicating the first difference is greater than the fast threshold value, the second compare result indicating the second difference is greater than the medium threshold value, or the third compare result indicating the third compare result is greater than the slow threshold value.

13. The method as recited in claim 12 further comprising supplying as the first clock signal a reference clock signal to a phase and frequency detector (PFD) of a phase-locked loop (PLL) and supplying as the second clock signal a feedback clock signal to the PFD from a feedback divider of the PLL.

14. The method as recited in claim 13 further comprising converting the first clock signal to digital representations of the first clock signal in a first time to digital converter and converting the second clock signal to digital representations of the second clock signal in a second time to digital converter.

15. The method as recited in claim 12 comprising:
receiving digital representations of the first clock signal at a first difference circuit and providing the first clock period representations of the first clock signal from the first difference circuit; and
receiving digital representations of the second clock signal at a second difference circuit and providing the second clock period representations of the second clock signal from the second difference circuit.

16. The method as recited in claim 12, further comprising:
logically ORing the frequency error signal and a phase error signal to provide a timing error signal.

17. The method as recited in claim 16 further comprising validating the timing error signal by supplying a validated deasserted timing error signal responsive to the timing error signal being stable for a predetermined time period.

18. The method as recited in claim 16, further comprising:
deasserting a loss of lock status that is based on the timing error signal responsive to expiration of a time period based, at least in part, on a bandwidth of a phase-locked loop associated with the loss of lock status.

19. The method as recited in claim 18, further comprising further basing the time period on a phase error threshold value, the slow threshold value, the medium threshold value, or the fast threshold value.

20. The method as recited in claim 11, further comprising:
receiving a phase difference signal indicative of a phase difference between the first clock signal and the second clock signal;
asserting a phase error signal responsive to the phase difference being greater than a phase threshold;
generating a phase error average between the first clock signal and the second clock signal in a filter;
comparing the phase error average to a phase error average threshold; and
asserting the phase error signal responsive to the phase error average being above the phase error average threshold.

21. An apparatus comprising:
a phase locked loop including,
a first time to digital converter to convert a feedback clock signal to a first digital representation;
a second time to digital converter to convert a reference clock signal to a second digital representation;
a digital phase and frequency detector coupled to receive the first and second digital representations of the feedback clock signal and the reference clock signal and supply a digital phase difference between the feedback clock signal and the reference clock signal;
a loss of lock detection circuit including,
a frequency monitoring circuit configured to supply a frequency loss of lock signal;
a phase monitoring circuit configured to supply a phase loss of lock signal;
a logical function to combine the frequency loss of lock signal and the phase loss of lock signal into a loss of lock signal;
wherein the frequency monitoring circuit includes,
a first moving average filter coupled to the first time to digital converter, the first moving average filter having cascaded filter stages;
a second moving average filter coupled to the second time to digital converter, the second moving average filter having cascaded filter stages;
a first error detection circuit to determine a first difference between an output of a first filter stage of the first moving average filter and an output of a first filter stage of the second moving average filter and to compare the first difference to a first threshold value and supply a first compare result indicative thereof;
a second error detection circuit to determine a second difference between an output of a second filter stage of the first moving average filter and an output of a second filter stage of the second moving average filter and compare the second difference to a second threshold value and supply a second compare result indicative thereof;

a third error detection circuit to determine a third difference between an output of a third filter stage of the first moving average filter and an output of a third filter stage of the second moving average filter and compare the third difference to a third threshold value and supply a third compare result indicative thereof;

a frequency error detection circuit configured to assert the frequency loss of lock signal responsive to the first compare result indicating the first difference is greater than the first threshold value, the second compare result indicating the second difference is greater than the second threshold value, or the third compare result indicating the third compare result is greater than the third threshold value; and a phase error monitoring circuit coupled to receive the digital phase difference and assert the phase loss of lock signal responsive to the digital phase difference being greater than a phase error threshold value.

* * * * *